United States Patent
Danyuk et al.

(10) Patent No.: US 10,720,895 B2
(45) Date of Patent: Jul. 21, 2020

(54) FULLY-DIFFERENTIAL PROGRAMMABLE GAIN AMPLIFIER

(71) Applicant: Harman International Industries, Incorporated, Stamford, CT (US)

(72) Inventors: Dimitri Danyuk, Shelton, CT (US); Todd A. Eichenbaum, Oxford, CT (US)

(73) Assignee: HARMAN INTERNATIONAL INDUSTRIES, INCORPORTED, Stamford, CT (US)

( * ) Notice: Subject to any disclaimer, the term of this patent is extended or adjusted under 35 U.S.C. 154(b) by 0 days.

(21) Appl. No.: 16/139,689

(22) Filed: Sep. 24, 2018

(65) Prior Publication Data

US 2020/0099353 A1 Mar. 26, 2020

(51) Int. Cl.
| H03F 1/02 | (2006.01) |
| H03F 3/45 | (2006.01) |
| H03G 1/00 | (2006.01) |
| H03G 3/00 | (2006.01) |

(52) U.S. Cl.
CPC ..... *H03F 3/45605* (2013.01); *H03F 3/45085* (2013.01); *H03G 1/0088* (2013.01); *H03G 3/001* (2013.01); *H03F 3/45475* (2013.01)

(58) Field of Classification Search
CPC .. H03F 3/45605; H03F 3/45475; H03F 1/303; H03F 3/005; H03F 3/45183; H03F 3/45085; H03G 1/0023; H03G 1/0088; H03G 3/001
USPC ..................................................... 330/9, 254
See application file for complete search history.

(56) References Cited

U.S. PATENT DOCUMENTS

| 7,034,735 | B1 | 4/2006 | Copley | |
| 7,199,664 | B2* | 4/2007 | Bult | H01F 17/0006 257/E27.046 |
| 7,605,659 | B2* | 10/2009 | Hughes | H03F 3/45475 330/254 |
| 7,660,571 | B2* | 2/2010 | Chang | H03G 1/0088 333/81 R |

(Continued)

OTHER PUBLICATIONS

European Search Report for Application No. EP 19 19 9338, dated Jan. 22, 2020 (2 pages).

*Primary Examiner* — Khanh V Nguyen
(74) *Attorney, Agent, or Firm* — McCoy Russell LLP (57) ABSTRACT

A programmable a fully-differential programmable gain amplifier for reducing distortion, switching transients and interference, and improving bandwidth. In one embodiment, the amplifier includes a programmable gain module, an amplifier coupled to the current mode outputs and a data latch circuit of the programmable gain module, the amplifier configured to apply common mode voltage to the data latch circuit, and a current-to-voltage converter. In one embodiment, the fully-differential programmable gain amplifier controls distortion and switching interference during amplification by sensing common mode signals to produce an error signal, and applying the resulting error signal to the programmable gain module for multiplying digital to analog conversion. Components of the fully-differential programmable gain amplifier provide compensation of distortion caused by nonlinearity of device switches and switch resistance, and can include a floating supply, galvanic isolation of control signals and a common mode voltage controller.

20 Claims, 7 Drawing Sheets

(56) References Cited

U.S. PATENT DOCUMENTS

| | | |
|---|---|---|
| 2003/0071673 A1 | 4/2003 | Jordanger |
| 2004/0121735 A1 | 6/2004 | Tseng |
| 2005/0140451 A1* | 6/2005 | Tam .................... H03G 1/0088 |
| | | 330/284 |
| 2006/0232458 A1 | 10/2006 | Copley |

* cited by examiner

FULLY-DIFFERENTIAL PROGRAMMABLE GAIN AMPLIFIER

FIELD

The present disclosure generally relates to audio amplifiers, and more particularly, to fully-differential programmable gain amplifiers and a high efficiency audio amplifier systems and processes.

BACKGROUND

Figure 1A:
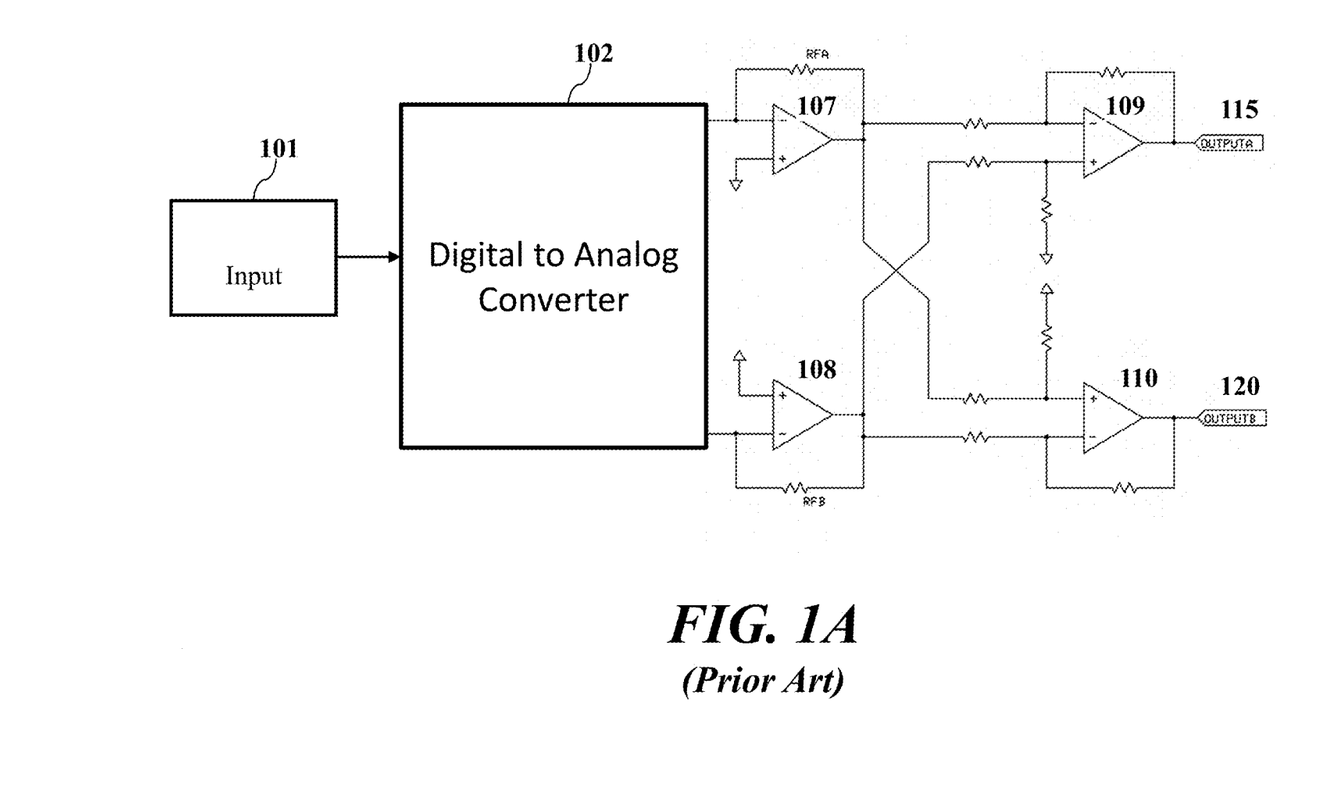
FIG. 1A is a circuit diagram of a prior art differential gain amplifier.

FIG. 1A is a circuit diagram of a prior art differential programmable gain amplifier 100 with input 101. The differential gain amplifier 100 includes a multiplying digital to analog converter (DAC) 102, first current-to-voltage converter 107, second current-to-voltage converter 108, first differential amplifier 109 and second differential amplifier 110. The input signal of differential programmable gain amplifier 100 is received by input 101. Current-to-voltage converters 107 and 108 translate the portion of the input current remaining after passing through DAC 102 into a voltage signal. The voltage signal from the outputs of current-to-voltage converters 107 and 108 are applied to inputs of the first differential amplifier 109 and the second differential amplifier 110. First differential amplifier 109 and the second differential amplifier 110 sense the voltage between outputs of current-to-voltage converters 107 and 108 and produce differential output on outputs 115 and 120. However, this configuration requires an undesirably high number of components and high tolerances. In order for differential gain amplifier 100 to operate efficiently, components of differential gain amplifier 100 must be matched. By way of example, differential gain amplifier 100 requires matching of components, such as current-to-voltage converters 107 and 108. In addition, differential gain amplifier 100 requires four operational amplifiers to produce the differential output. There is a desire for a differential amplifier circuit that does not require high tolerances of the components in differential amplifiers nor so many amplifying circuits in the signal path. There is also a desire for a differential amplifier that maintains a high common-mode rejection ratio, low control signal interference and low signal distortion.

Figure 1B:
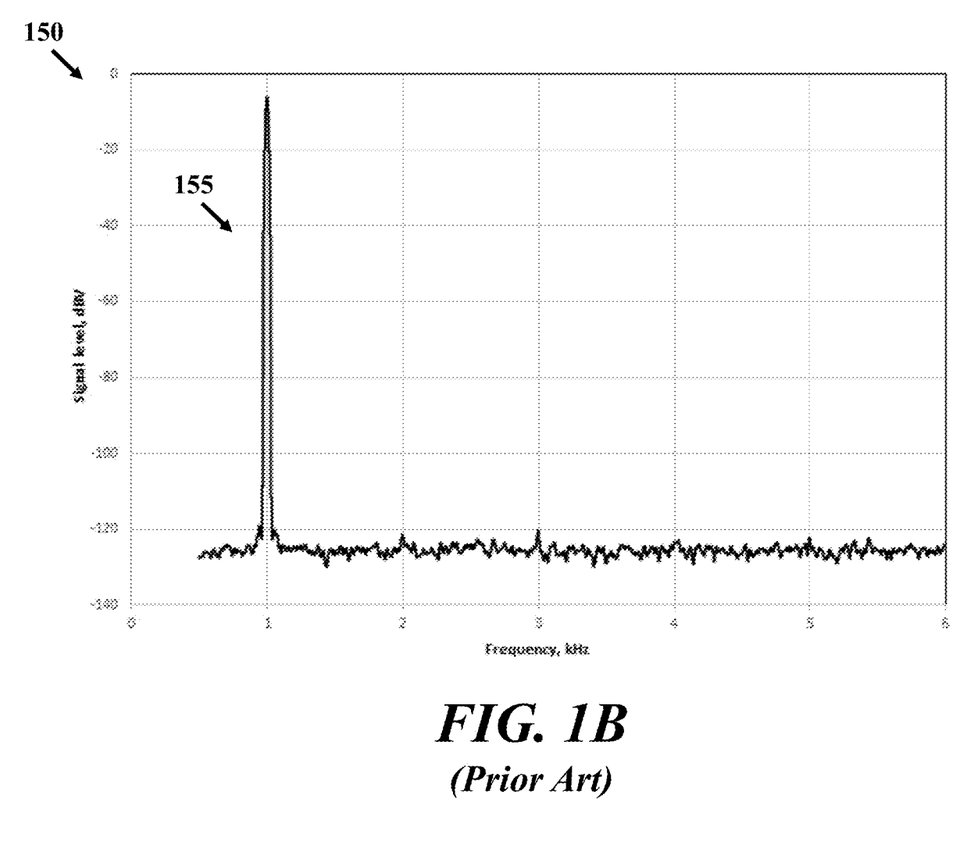
FIG. 1B is an exemplary output spectrum for a prior art differential programmable gain amplifier having symmetrical input.

FIG. 1B shows an exemplary output spectrum 150 for differential programmable gain amplifier 100 with a symmetrical drive. Differential programmable gain amplifier 100 compensates distortion caused by nonlinearity of MOSFET switches of DAC 102. Resistance of a closed MOSFET switch is a function of applied voltage. Full distortion compensation takes place when the signals on inputs have equal amplitude and opposite phase. By way of example, an input signal, such as a pure 1 kHz sine wave, having signals on input 101 with equal amplitude and opposite phase will generate spectrum 150 having with peak 155.

Figure 1C:
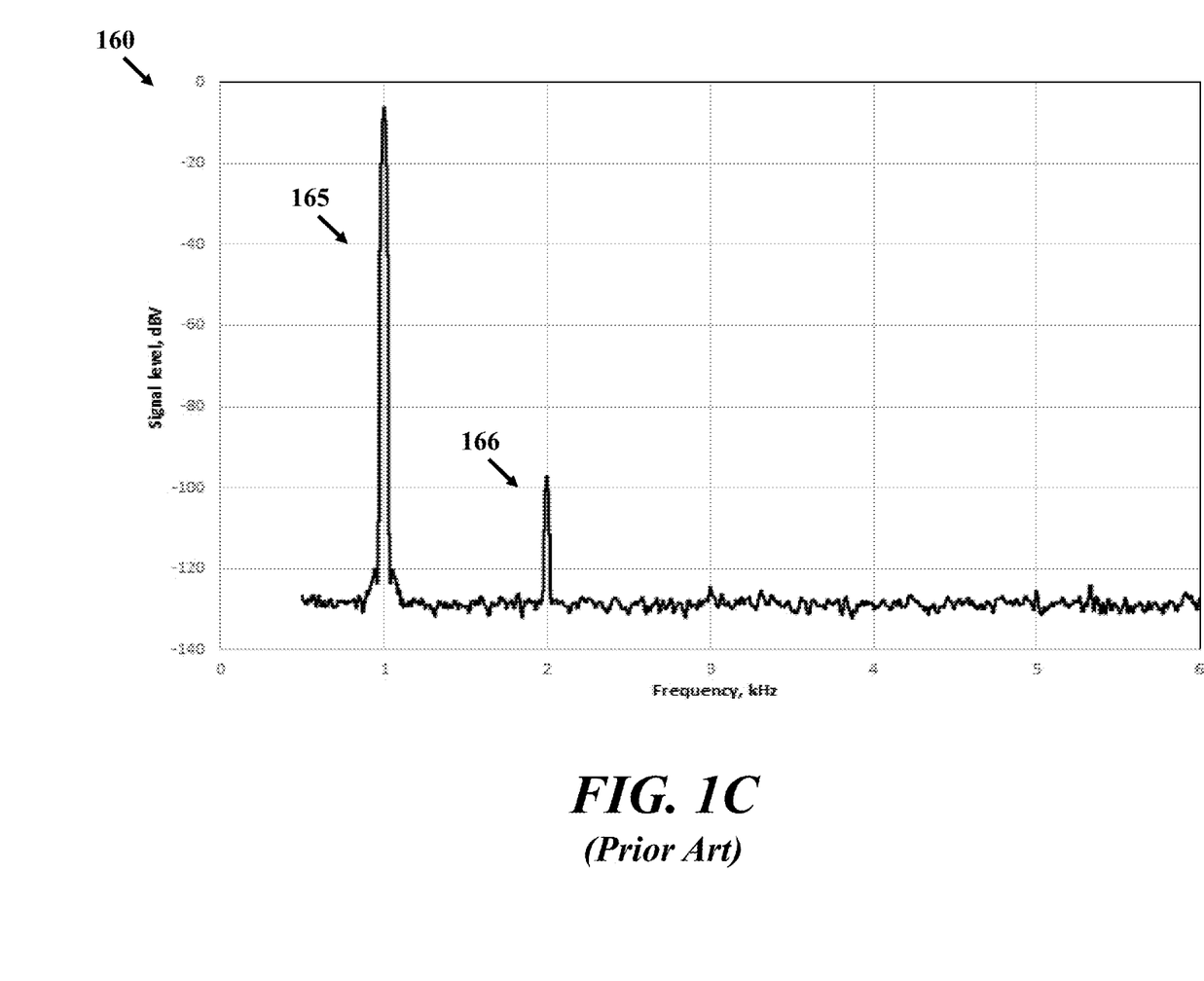
FIG. 1C is a an exemplary output spectrum for a prior art differential programmable gain amplifier having asymmetrical input.

FIG. 1C shows an exemplary output spectrum 160 for differential programmable gain amplifier 100 with asymmetrical drive. For example, an input signal having a pure 1 kHz sine wave, with the input signal applied to a single input terminal or input 102 and second input signal terminal shorted to ground, will generate output spectrum 160 having peak 165 and second order distortion shown by peak 166. Differential programmable gain amplifier 100 does compensated second order distortion.

BRIEF SUMMARY OF THE EMBODIMENTS

Disclosed and claimed herein are a device and methods for amplifying a differential signal. One embodiment is directed to a fully-differential programmable gain amplifier including a first input, a second input, a first output, a second output, and a programmable gain module coupled to the first input and the second input. According to one embodiment, the programmable gain module includes a data latch circuit configured to control the first set of switches for the first resistive ladder network to provide output to the first current mode output, and control the second set of switches for the first resistive ladder network to provide output to the second current mode output. According to one embodiment, fully-differential programmable gain amplifier includes an amplifier coupled to the first current mode output, the second current mode output, and the data latch circuit, the amplifier configured to apply common mode voltage to the data latch circuit. According to one embodiment, fully-differential programmable gain amplifier includes a current-to-voltage converter coupled to the first current mode output, the second current mode output, the first output and the second output. In one embodiment, the current-to-voltage converter is configured to receive at least one output current mode signal from the first current mode output and the second current mode output, and produce an output signal by converting differential input received from the at least one output current mode signal from the first current mode output and the second current mode output.

In one embodiment, the programmable gain module is a dual multiplying digital to analog converter.

In one embodiment, the programmable gain module includes a first resistive ladder network coupled to the first input, a first set of switches for the first resistive ladder network, the first set of switches coupled to a first current mode output, a second resistive ladder network coupled to the second input, and a second set of switches for the first second ladder network, the second set of switches coupled to a second current mode output. According to one embodiment, the data latch circuit is configured to control the first set of switches for the first resistive ladder network to provide output to the first current mode output, and control the second set of switches for the first resistive ladder network to provide output to the second current mode output.

In one embodiment, the programmable gain module receives control signals to adjust amplification of at least one signal received relative to the first input first and second input signals.

In one embodiment, the amplifier is a voltage follower with the positive input connected to a voltage ladder between the first current mode output and second current mode output, the negative input connected to an output of the voltage follower by a negative feedback loop and a floating ground supply of the programmable gain module.

In one embodiment, the amplifier is a correction module configured to sense a common-mode signal between first current mode output and second current mode output and to provide corrective feedback to the programmable gain module.

In one embodiment, the current-to-voltage converter is differential module configured to produce a positive output signal to the first output and a negative output signal to the second output, wherein the first output and second output are opposite each other and equal in magnitude to the difference between the amplified first and second input signals.

In one embodiment, the current-to-voltage converter includes a first output feedback loop coupled to the first output and an input of the current-to-voltage converter, and a second output feedback loop coupled to the first output and an input of the current-to-voltage converter.

In one embodiment, the fully-differential programmable gain amplifier includes a floating supply to power the programmable gain module.

In one embodiment, the fully-differential programmable gain amplifier includes a galvanic isolator coupled to the programmable gain module, the galvanic isolator configured to block low voltage DC current to the programmable gain module.

Another embodiment is direct to a fully-differential programmable gain amplifier including a first input, a second input, a first output, a second output and a programmable gain module coupled to the first input and the second input. The programmable gain module including a first resistive ladder network coupled to the first input, a first set of switches for the first resistive ladder network, the first set of switches coupled to a first current mode output, a second resistive ladder network coupled to the second input, a second set of switches for the first second ladder network, the second set of switches coupled to a second current mode output, and a data latch circuit. The data latch circuit configured to control the first set of switches for the first resistive ladder network to provide output to the first current mode output, and control the second set of switches for the first resistive ladder network to provide output to the second current mode output. The fully-differential programmable gain amplifier including an amplifier coupled to the first current mode output, the second current mode output, and the data latch circuit, the amplifier configured to apply common mode voltage to the data latch circuit. The fully-differential programmable gain amplifier including a current-to-voltage converter coupled to the first current mode output, the second current mode output, the first output and the second output, the current-to-voltage converter configured to receive at least one output current mode signal from the first current mode output and the second current mode output, and produce an output signal by converting differential input received from the at least one output current mode signal from the first current mode output and the second current mode output.

Another embodiment is directed to a method for fully-differential programmable gain amplifying. In one embodiment the method includes receiving, by a programmable gain module of a fully-differential programmable gain amplifier, an input signal, receiving, by the programmable gain module, a control signal, and supplying, by the programmable gain module, at least one output current mode signal from to first current mode output and to a second current mode output to provide a differential input signal, wherein output of the programmable gain module is in response to the control signal. The method also includes sensing, by an amplifier of the fully-differential programmable gain amplifier, a common mode voltage to feed a common mode of the programmable gain module. The method also includes producing, by a current-to-voltage of the fully-differential programmable gain amplifier, an output signal by converting the differential input signal, wherein the output signal is the input signal amplified based on the control signal.

In one embodiment, the amplifier is configured as a voltage follower with the positive input connected to a voltage ladder between the circuit paths of the amplified first and second input signals, the negative input connected to the voltage follower's output via a negative feedback loop, and output connected to the floating ground of the programmable gain module.

In one embodiment, the correction module senses the common-mode signal between the amplified first and second input signals and sends corrective feedback to the programmable gain module.

In one embodiment, the correction module compensates for distortion caused by MOSFET switches of the fully-differential programmable gain amplifier.

In one embodiment, the programmable gain module receives control signals to adjust amplification of at least one signal received relative to the first input first and second input signals.

In one embodiment, the amplifier is a voltage follower with the positive input connected to a voltage ladder between the first current mode output and second current mode output, the negative input connected to an output of the voltage follower by a negative feedback loop and a floating ground supply of the programmable gain module.

In one embodiment, the amplifier is a correction module configured to sense a common-mode signal between first current mode output and second current mode output and to provide corrective feedback to the programmable gain module.

In one embodiment, the differential module is a fully-differential current-to-voltage converter with a first resistive feedback loop connecting the positive output signal path to the amplified first signal path and a second resistive feedback loop connecting the negative output signal path to the amplified second signal path.

In one embodiment, the fully-differential programmable gain amplifier is configured to control distortion and switching interference during amplification by sensing common mode signal on outputs of a first current path and a second current path, comparing common mode signal on the outputs of the first current path and a second current path with ground, amplifying the common mode signal on the outputs of the first current path and the second current path with the ground to produce an error signal, and applying the resulting error signal to the programmable gain module for multiplying digital to analog conversion.

Other aspects, features, and techniques will be apparent to one skilled in the relevant art in view of the following detailed description of the embodiments.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE EXEMPLARY EMBODIMENTS

Overview and Terminology

One aspect of the disclosure is directed to providing a fully-differential programmable gain amplifier with improved performance and reduced component requirements. The present disclosure relates to fully-differential programmable gain amplifier and improved method of reducing switching transients and interference, reducing distortion, and extending bandwidth.

Another aspect of the disclosure is directed to providing a fully-differential programmable gain amplifier. In one embodiment, a fully differential programmable gain amplifier is provided that only requires the use of a dual DAC and a fully differential operational amplifier. A further aspect is to provide a fully differential programmable gain amplifier which does not introduce noticeable distortion in the analog output with unbalanced input signal due to substantially different voltage drop across MOSFET switches.

A device and methods are provided for accepting two differential input voltages and producing two differential output voltages, wherein the difference between the two output voltages is equal to the difference between the two input voltages.

One embodiment is directed to a fully-differential programmable gain amplifier including a programmable gain module, an amplifier coupled to the current mode outputs and a data latch circuit of the programmable gain module, the amplifier configured to apply common mode voltage to the data latch circuit, and a current-to-voltage converter. According to one embodiment, the programmable gain module is configured to control the set of switches of a resistive ladder network to provide output to the current mode output. In one embodiment, the current-to-voltage converter is configured to receive at least one output current mode signal and produce an output signal by converting received differential input. Components of the fully-differential programmable gain amplifier provide compensation of distortion caused by nonlinearity of device switches and switch resistance.

In one embodiment, an amplifier includes common-mode rejection and digital gain control. The amplifier also includes a first multiplying DAC configured to supply current to a first input of a fully-differential amplifier and a second multiplying DAC configured to supply current to a second input of the fully-differential amplifier, wherein said first and second multiplying DACs are configured to modulate the current in said first current path and said second current path in response to a differential input signal, thereby producing an input differential signal defined by the difference in currents in said first current path and said second current path. The amplifier also includes a fully-differential current-to-voltage converter configured to produce an output signal by converting said differential input signal.

In one embodiment a fully-differential programmable gain amplifier is configured for providing high common mode rejection, low distortion and high rejection of switching transients and interference. The fully-differential programmable gain amplifier can include a first resistive R-2R ladder network with a set of single-pole double-throw switches configured to receive a half of differential input voltage and a second resistive R-2R ladder network with a set of single-pole double-throw switches configured to receive a half of differential input voltage. The fully-differential programmable gain amplifier can also include a data latch circuit configured to transfer digital control signals to said sets of single-pole double-throw switches, and a fully-differential current-to-voltage converter configured to receive output current mode signals provided from said first and second resistive R-2R ladder networks through said sets of single-pole double-throw switches. The fully-differential programmable gain amplifier can include an additional amplifier configured to sense common-mode voltage on the inputs of said fully-differential current-to-voltage converter, to compare common-mode voltage to ground, to amplify the difference between common-mode voltage and ground and to feed the common node of said data latch circuit.

In one embodiment, the fully-differential programmable gain amplifier is configured to control distortion and switching interference during amplification by sensing common mode signal on outputs of a first current path and a second current path, comparing common mode signal on the outputs of the first current path and a second current path with ground, amplifying the common mode signal on the outputs of the first current path and the second current path with the ground to produce an error signal, and applying the resulting error signal to the programmable gain module for multiplying digital to analog conversion.

As used herein, a fully differential programmable gain amplifier includes plus and minus inputs, wherein the voltage different between the plus and minus inputs is the input differential voltage. The average of the two input voltages is the input common-mode voltage. The fully differential programmable gain amplifier includes plus and minus outputs. The difference between the voltages at the plus and minus outputs is the output differential voltage. The output common mode voltage is the average of the two output voltages and is controlled by the voltage at output common mode voltage.

According to one embodiment, amplifiers and amplifier systems discussed herein relate to amplifier systems used in an audio system and/or for audio signals. Signals amplified may include single ended and doubled ended input (e.g., balanced, differential, etc.). Differential signaling and inputs may relate to signals for used in audio, data transmission, and communication systems. Differential input may be used for high-speed data acquisition, and can require a differential amplifier. Advantages of differential signaling can include reduced even-order harmonics and increased dynamic range.

Another embodiment is directed to a method for fully-differential programmable gain amplifying. In one embodiment the method includes receiving, by a programmable gain module of a fully-differential programmable gain amplifier, an input signal, receiving, by the programmable gain module, a control signal, and supplying, by the programmable gain module, at least one output current mode signal from to first current mode output and to a second current mode output to provide a differential input signal, wherein output of the programmable gain module is in response to the control signal. The method also includes sensing, by an amplifier of the fully-differential programmable gain amplifier, a common mode voltage to feed a common mode of the programmable gain module. The method also includes producing, by a current-to-voltage of the fully-differential programmable gain amplifier, an output signal by converting the differential input signal, wherein the output signal is the input signal amplified based on the control signal.

Another embodiment is directed to processes for controlling distortion and switching interference during amplification, said method comprising steps of sensing the common mode signal on the outputs of a first current path and a second current path, comparing the common mode signal on the outputs of a first current path and a second current path with the ground, amplifying the common mode signal on the outputs of a first current path and a second current path with the ground to produce an error signal, and applying the resulting error signal to digital control signal for multiplying DACs.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment," "certain embodiments," "an embodiment," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation.

Exemplary Embodiments

Figure 2:
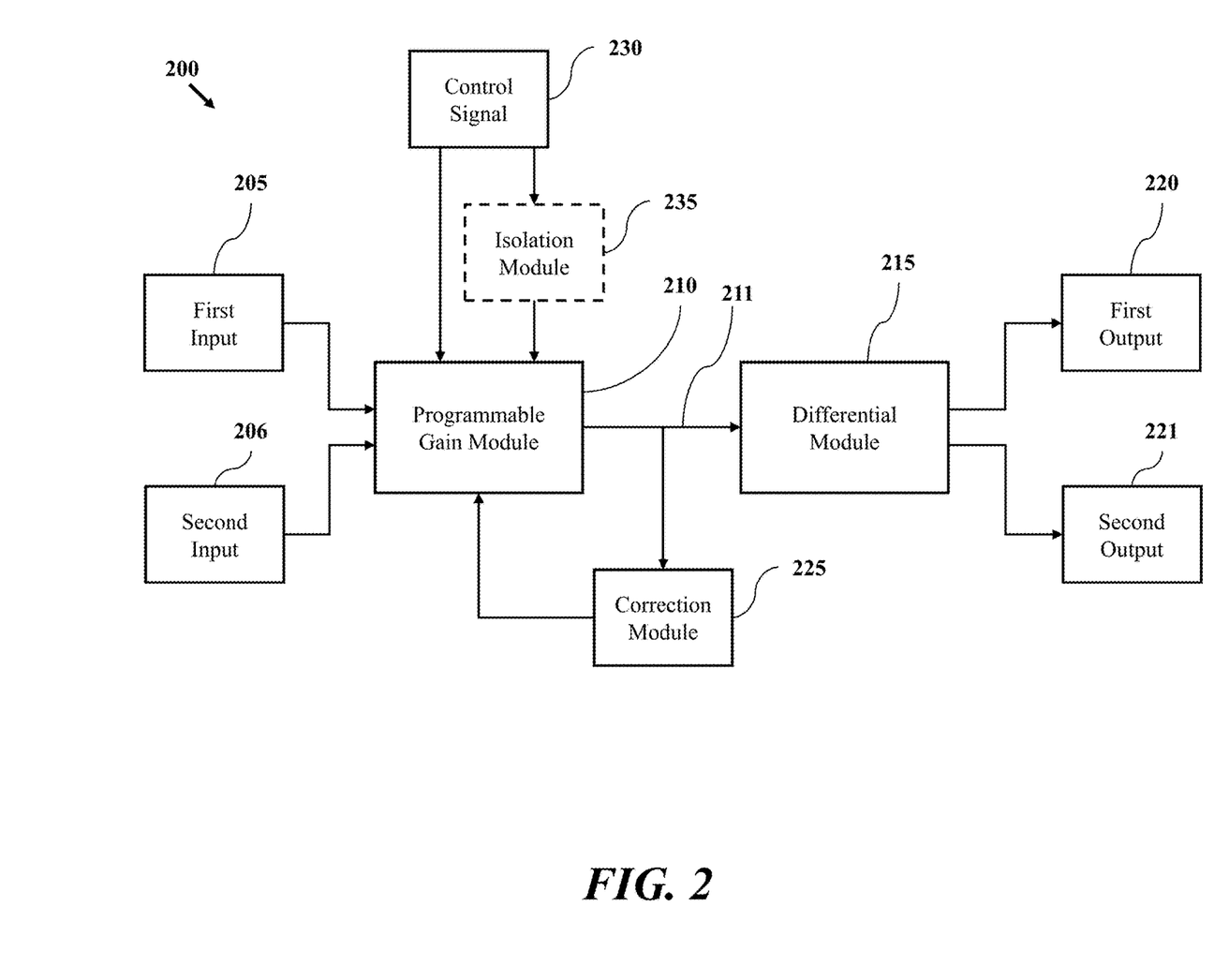
FIG. 2 is a graphical representation of a fully-differential programmable gain amplifier according to one or more embodiments.

Referring now to the figures, FIG. 2 depicts a graphical representation of a fully-differential programmable gain amplifier according to one or more embodiments. FIG. 2 is shown as a block diagram for components of a fully-differential programmable gain amplifier 200. According to one embodiment, fully-differential programmable gain amplifier 200 includes one or more components configured to reduce switching transients and interference, reduce distortion and extending bandwidth. As will be discussed in more detail with respect to FIG. 3A, a circuit arrangement may be provided for the components of the fully-differential programmable gain amplifier 200. Fully-differential programmable gain amplifier 200 may be used in an audio system. Accordingly, fully-differential programmable gain amplifier 200 maybe configured to amplify audio signals, including balanced and single ended input audio signals.

According to one embodiment, fully-differential programmable gain amplifier 200 includes a first input 205, a second input 206, programmable gain module 210, differential module 215 and correction module 225, first output 220 and second output 221.

First input 205 and second input 206 relate to the input of fully-differential programmable gain amplifier 200, wherein the input signal received at first input 205 and second input 206 may be amplified. According to one embodiment, first input 205 and second input 206 may be configured to receive differential input. In certain embodiments, signals received may relate to balanced or single ended inputs. Balanced inputs may be based on voltage between two individual inputs, such as first input 205 and second input 206 may, within a common mode range. A balanced input may have signals with an opposite polarity. By way of example, a balanced input (e.g., differential signal input) may be provided by inputs carrying signals of opposite polarity to each other (e.g., TRS and XLR connectors, etc.). In certain embodiments, an input of fully-differential programmable gain amplifier 200 received a single ended input relates to a source providing voltage between the input channel high and low level ground common to all the inputs.

Programmable gain module 210 is configured to supply at least one output current mode signal to provide a differential input signal for differential module 215 of fully-differential programmable gain amplifier 200. In one embodiment, programmable gain module 210 is configured to receive input for fully-differential programmable gain amplifier 200 from first input 205 and second input 206. Accordingly, programmable gain module 210 may be coupled to first input 205 and second input 206.

According to one embodiment, programmable gain module 210 may include a data latch circuit configured to control a set of switches for first input 205 (e.g., first set of switches) and a second set of switches for second input 206 (e.g., second set of switches). As will be discussed in more detail with respect to FIG. 3A, programmable gain module 210 may include first resistive ladder network to provide output to the first current mode output and a second resistive ladder network to provide output to a second current mode output, and control the second set of switches for the first resistive ladder network to provide output to the second current mode output. Gain adjustment of an amplifier 200 can be accomplished by connecting a resistance ladder (R-2R) digital-to-analog converter (i.e. multiplying DAC) as a programmable gain element to the amplifier input, such as first input 205 and second input 206. When placed in a feedback loop the multiplying DAC of programmable gain module 210 permits adjustment of the feedback current, and thus gain, for the amplifier by allowing adjustment for the impedance of the circuit. In one embodiment, the multiplying DAC of programmable gain module 210 is placed in the negative feedback loop. According to one embodiment, programmable gain module 210 may include two complementary multiplying digital to analog converters (DAC).

With conventional arrangements including two multiplying DACs, problems may be presented maintaining common-mode rejection and low interference from digital control signals. Embodiments allow for amplifier 200 to recover the differential signal while also maintaining common-mode rejection and low interference from digital control signals.

Output 211 of programmable gain module 210 may include a first common mode output and a second common mode output. Output 211 of programmable gain module 210 may be based on first current mode output and second current mode output circuit paths of the amplified first and second input signals received from first input 205 and second input 206, respectively.

Common-mode voltage is the voltage signal in common between the two inputs of differential module 215. Principles of the disclosure, including the components and arrangement of components of amplifier 200 provide a high common-mode rejection ratio to keep the common-mode voltage from affecting the output voltage.

According to one embodiment, the programmable gain module 210 receives a control signal 230 to control amplification. In certain embodiments, gain module 210 receives a control signal 230 directly. In other embodiments, gain module 210 receives a control signal 230 by way of isolation module 235, which may be optional. Isolation module 235 may include a galvanic isolator to block low voltage DC current. Isolation module 235 may be configured to transfer digital control signals to a data latch circuit programmable gain module 210; as such the control signals may pass through an isolation module.

According to one embodiment, the programmable gain module 210 uses a floating power source as its reference voltage.

According to one embodiment, correction module 225 is coupled to the current mode outputs of programmable gain module 210. Correction module 225 may include an amplifier configured to apply common mode voltage to a data latch circuit of programmable gain module 210. Correction module 225 provides feedback to programmable gain module 210.

Output 211 of programmable gain module 210 may be received by differential module 215. According to one embodiment, differential module 215 may include a current-to-voltage converter coupled to output 211, such as first current mode output and the second current mode output. Differential module 215 may produce an output signal by converting differential input received from the at least one output current mode signal from the first current mode output and the second current mode output. Output of differential module 215 may be a differential output to first output 220 and second output 221. In one embodiment, differential module 215 may provide the positive and negative output signals to other devices by way of first output 220 and second output 221.

Figure 3A:
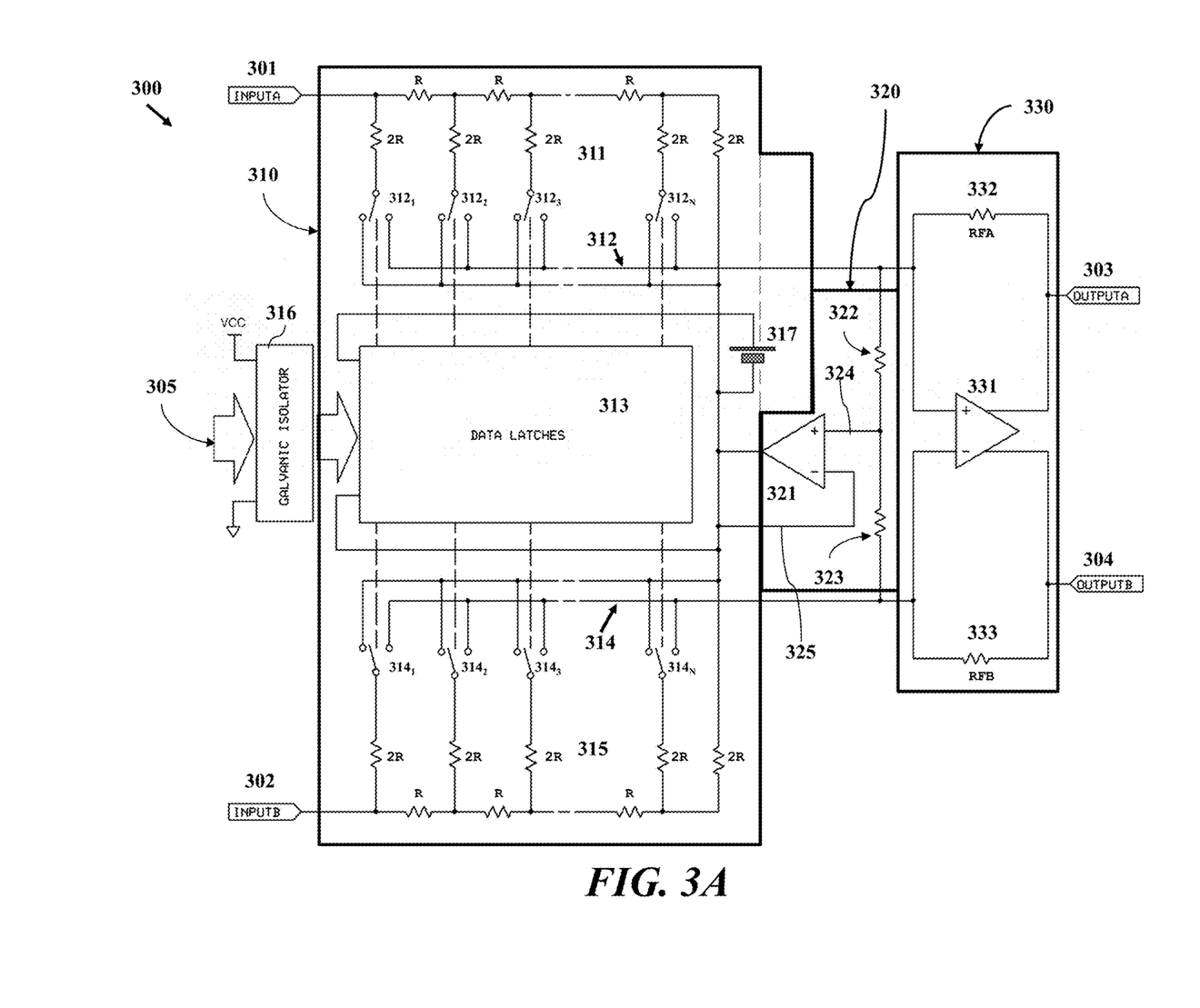
FIG. 3A is a circuit diagram of a fully-differential programmable gain amplifier according to one or more embodiments.

FIG. 3A is a circuit diagram of a fully-differential programmable gain amplifier according to one or more embodiments. According to one embodiment, fully-differential programmable gain amplifier 300 may be configured to operate with differential inputs and differential outputs. According to another embodiment, fully-differential programmable gain amplifier 300 is configured to reducing switching transients and interference, reducing distortion and extending bandwidth.

According to one embodiment, fully-differential programmable gain amplifier 300 includes a first input 301, a second input 302, first output 303, second output 304, programmable gain module 310, correction module 320, and differential module 330.

According to one embodiment, first input 301 and second input 302 may be configured to receive an input signal to be amplified. In one embodiment, first input 301 and second input 302 may be configured to receive a differential input. In another embodiment, first input 301 and second input 302 may be configured to receive a balanced input. According to another embodiment, first input 301 and second input 302 may be configured to receive a single ended input. Differential signals may be less sensitive to external disturbances like small voltage differences between grounds and thus, advantageous for route the signal to another circuit (which might be on a different ground) while keeping the signal noise and disturbance free. Fully-differential programmable gain amplifier 300 can provide a single ended signal anyway by using one output of the amplifier.

Programmable gain module 310 is coupled to first input 301 and second input 302 and configured to receive input signals. According to one embodiment, input signals received form first input 301 are routed to a first current path of programmable gain module 310 and input signals received form second input 302 are routed to a second current path of programmable gain module 310. According to one embodiment, operation of fully-differential programmable gain amplifier 300 to control gain (e.g., amplification) of signals received at first input 301 and second input 302, may be controlled by a control signal received by input 305.

According to one embodiment, programmable gain amplifier 310 includes a dual multiplying DAC configuration including a first resistance (R-2R) ladder network 311, a second resistance (R-2R) ladder network 315, first set of single-pole double-throw switches $312_{1-n}$, a second set of single-pole double-throw switches $314_{1-n}$ and data latch circuit 313 (e.g., data latches). According to one embodiment, first resistance (R-2R) ladder network 311 and second resistance (R-2R) ladder network 315 each are formed from an electrical circuit made from repeating units of resistors. First resistance (R-2R) ladder network 311 and second resistance (R-2R) ladder network 315 may be formed by one of a string resistor ladder and an R-2R ladder. An R-2R Ladder configuration may provide a simple and inexpensive way to perform digital-to-analog conversion, where the repetitive arrangements of precise resistor networks in a ladder-like configuration. A string resistor ladder configuration may implement a non-repetitive reference network.

Gain adjustment of fully-differential programmable gain amplifier 300 can be accomplished by connecting a resistance ladder (R-2R), such as first resistance (R-2R) ladder network 311 or second resistance (R-2R) ladder network 315, to digital-to-analog converter (i.e. multiplying DAC) of programmable gain amplifier 300 as a programmable gain element to the amplifier's input or inputs. When placed in the feedback loop, the multiplying DAC of programmable gain amplifier 300 permits adjustment of the feedback current, and therefore gain, for the fully-differential programmable gain amplifier 300 by allowing adjustment for the impedance of the circuit. The multiplying DAC may be placed in the negative feedback loop of the fully-differential programmable gain amplifier 300.

Galvanic isolator 316 transfers digital control signals from input 305 to data latch circuit 313, separating stray electrical currents from the main circuit to reduce interference from digital control signals. Galvanic isolator 316 may receive an input signal ranging from 0-5 volts or 0 to the Vcc (supply voltage). Output of the amplifier may be on the order to −208 to +208 volts.

Data latch circuit 313 provides digital control of electronic switches $312_{1-n}$ and $314_{1-n}$. According to one embodiment, a data latch circuit 313 is configured to control a first set of switches, such as switches $312_{1-n}$, for the first resistive ladder network to provide output to the first current mode output, and control a second set of switches $314_{1-n}$ for the second resistive ladder network to provide output to the second current mode output.

An important advantage of this configuration of fully-differential programmable gain amplifier 300 is minimization of transients for electronic switches $312_{1-n}$ and $314_{1-n}$ when changing their position between nodes with the same potential—ground and virtual ground (inputs of the current-to-voltage converters). Another advantage is mutual compensation of interference from switch control digital signals provided by differential module 330. In addition the configuration of fully-differential programmable gain amplifier 300 does not require a high number of components and high tolerances.

According to one embodiment, an input signal of programmable gain amplifier 300 includes is differential input to first input 301 (e.g., (INPUTA) and second input 302 (e.g., INPUTB). The positive input current from first input 301 (e.g., (INPUTA) is steered by switches $312_{1-n}$ to a first current mode output 312 which is coupled to a first input of the fully-differential current-to-voltage converter 330, or to a floating low impedance current sink. The negative input current from second input 302 (e.g., INPUTB is steered by switches $314_{1-n}$ to a second current mode output 314 which is coupled to a second input of the fully-differential current-to-voltage converter 330 or to a floating low impedance current sink. Fully-differential current-to-voltage converter 330 translates the portion of the input currents remaining after passing through dual multiplying DAC of programmable gain module 310 into a differential voltage signal.

According to one embodiment, correction module 320 includes an amplifier 321 coupled to the first current mode output 312, the second current mode output 314, and the data latch circuit 313. Amplifier 321 is configured to apply common mode voltage to the data latch circuit 313.

According to one embodiment, correction module 320 includes amplifier 321 as a voltage follower to sense the common mode voltage on the inputs of fully-differential current-to-voltage converter 330 and applies the common mode voltage to a digital control signal for multiplying DAC of programmable gain module 310. Voltage follower 321 of correction module 320 also provides a low-impedance current sink for the DAC resistive (R-2R) ladders programmable gain module 310. Correction module 320 provides a high common-mode rejection ratio that is desirable to keep the common-mode voltage from affecting the output voltage.

Floating supply 317 provides power for data latch circuit 313. Programmable gain module 310 includes floating ground from floating supply 317 and feedback from correction module 320 to adjust a voltage level of the floating ground. Programmable gain module 310 includes may use floating power supply 317 (e.g., floating power source) source as a reference voltage. According to one embodiment, floating power supply 317 prevents distortion, and can allow for matching source.

According to one embodiment, differential module 330 includes a current-to-voltage converter 331 coupled to the first current mode output 312, the second current mode output 314, first output 303 and second output 304. According to one embodiment, current-to-voltage converter 331 is configured to receive at least one output current mode signal from the first current mode output and the second current mode output, and produce an output signal by converting differential input received from the at least one output current mode signal from the first current mode output and the second current mode output.

A noninverting input of current-to-voltage converter 331 is connected with the inverting output, first output 303 (e.g., OUTPUTA) through resistor 332 (e.g., in series). According to one embodiment, resistor 332 can set the maximum gain of differential module 330. The inverting input current-to-voltage converter 331 is connected with the noninverting output, second output 304 (e.g., OUTPUTB) through a series resistor 333. According to one embodiment, resistor 333 can set the maximum gain of differential module 330. According to another embodiment, resistor 332 and resistor 332 may have the same resistance (e.g., matched). The output of fully-differential programmable gain amplifier 300 appears between first output 303 and second output 304.

The noninverting and inverting inputs of current-to-voltage converter 331 may both be connected to the input of the amplifier 321 through resistors 322 and 323 respectively. According to one embodiment, resistor 322 and resistor 323 may have the same resistance (e.g., matched). Because of the high open loop gain of voltage follower 321 the voltage between inputs of fully-differential current-to-voltage converter 331 is negligibly low. The output of amplifier 321 is equal to a fraction of the sum of the voltages on the input terminals of first input 301 (e.g., (INPUTA) and second input 302 (e.g., INPUTB). The voltage at the positive input 324 of voltage follower 321 (e.g., follower) may be equal to the average of the voltages on inputs of fully-differential current-to-voltage converter 331. The output of voltage follower 321 may be configured to be equal to or roughly equal to the positive input of fully-differential current-to-voltage converter 331. When the input voltages have the same amplitude but opposite sign the output of voltage follower 321 is equal to zero. The output voltage of the voltage follower 321 with the floating voltage source 317 feeds the data latch circuitry 313. Floating power supply 317 and voltage follower 321 power data latches 313 and thus, can shift control signals up and down, such as control signals for programmable gain amplifier 300 provided by input 305.

Floating power supply 317 may relate to the same power source for data latches 313. In contrast to connection of a minus terminal of floating power supply 317, the minus terminal of floating power supply 317 is coupled to data latches 313 and output of voltage follower 321. The output voltage follower 321 may be small, but an important addition to floating power supply 317. According to one embodiment, voltage follower 321 senses a common mode signal at the two inputs of current-to-voltage converter 331 and floats the latches of data latch circuit 313 on both sides, and floats what would be the ground signal.

The output voltage of voltage follower 321 also can provide balanced feedback to control voltage input to differential module 330. The output voltage of amplifier 321 also shifts the level of control signals of switches $312_{1-n}$ and $314_{1-n}$ by the average of the voltage on the 331 inputs and provides partial obtained from the data latch circuitry 313 and provides partial compensation of distortion associated with MOSFET switches nonlinearity. As such, fully-differential programmable gain amplifier 300 compensates for distortion caused by nonlinearity of MOSFET switches. Resistance of closed MOSFET switch is a function of applied voltage. Full distortion compensation takes place when the signals on first input 301 (e.g., (INPUTA) and second input 302 (e.g., INPUTB) have equal amplitude and opposite phase.

The output currents of programmable gain module 310 are steering in the inverting and noninverting inputs of fully-differential current-to-voltage converter 331. Noninverting input of fully-differential current-to-voltage converter 331 is connected with the inverting output through a series resistor 332, inverting input of fully-differential current-to-voltage converter 331 is connected with the noninverting output through a series resistor 333. The fully differential programmable gain amplifier output appears between first output 303 (e.g., OUTPUTA) and second output 304 (e.g., OUTPUTB).

Noninverting and inverting inputs of fully-differential current-to-voltage converter 331 are connected to the input of the voltage follower 321 with resistors 322, 323. Because of the high open loop gain the voltage between inputs of fully-differential current-to-voltage converter 331 is negligibly low. The output of the voltage follower 321 is equal to the fraction of the sum of the voltages on the first input 301 (e.g., (INPUTA) and second input 302 (e.g., INPUTB). When the input voltages on first input 301 (e.g., (INPUTA) and second input 302 (e.g., INPUTB) have the same amplitude but opposite sign, the output of voltage follower 321 is equal to zero. The output voltage of voltage follower 321 with the floating power supply 317 feed the data latch circuitry. The output voltage follower 321 modulates the switch control signals obtained from the data latch circuitry of data latches 313 and provides partial compensation of distortion associated with MOSFET switch nonlinearity as shown in FIG. 3B.

Figure 3B:
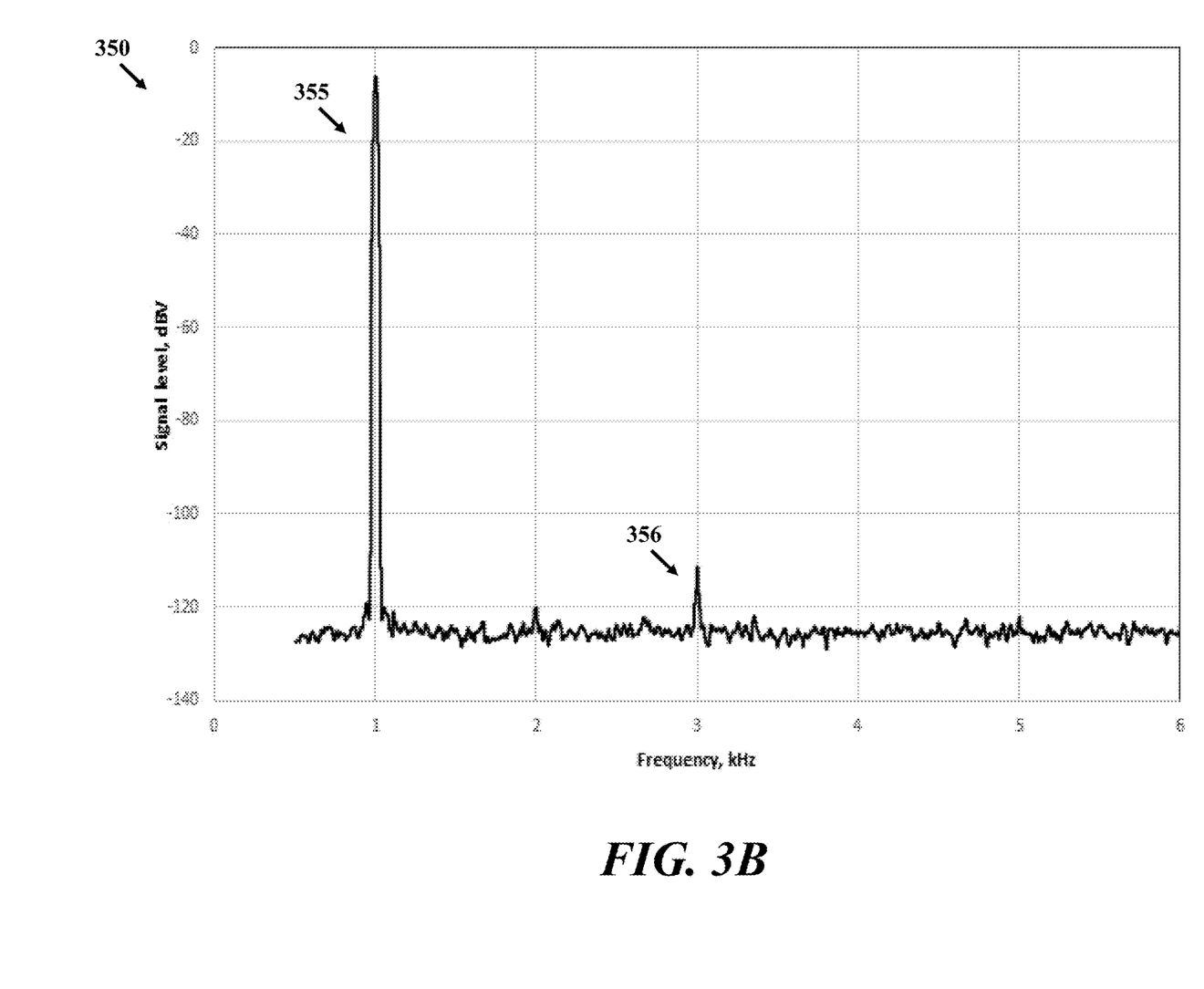
FIG. 3B is an exemplary output spectrum for fully-differential programmable gain amplifier according to one or more embodiments.

Referring now to FIG. 3B, an exemplary output spectrum 350 is shown for differential programmable gain amplifier 300 with asymmetrical drive. For example, an input signal having a pure 1 kHz sine wave, with the input signal applied to a single input terminal or input 301 and second input signal terminal 302 shorted to ground, will generate output spectrum 350 having peak 355 and second order distortion shown by peak 356. Differential programmable gain amplifier 300 compensates for second order distortion. By way of example, peak 356 represents partial compensation of distortion associated with MOSFET switch nonlinearity.

Benefits of fully-differential programmable gain amplifier 300 can include reducing the number of operational amplifiers (e.g., 1 amplifier of differential module 330 compared to 4 amplifiers of FIG. 1A). In addition, matching of amplifiers is not required.

Figure 4:
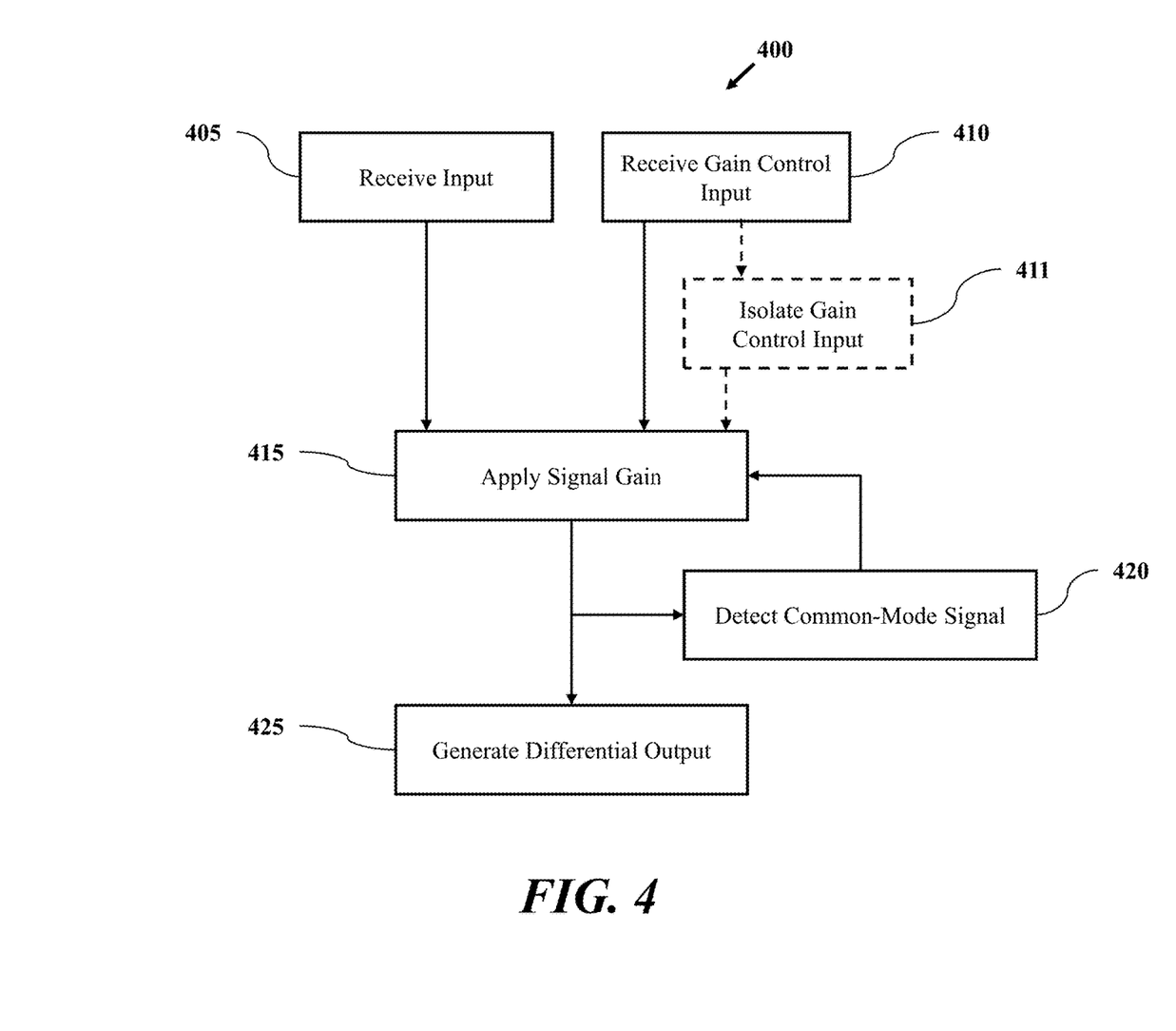
FIG. 4 depicts operations of a fully-differential programmable gain amplifier according to one or more embodiments.

FIG. 4 depicts operations of a fully-differential programmable gain amplifier according to one or more embodiments. Process 400 shows operations of a fully-differential programmable gain amplifier, such as fully-differential programmable gain amplifier 200 of FIG. 2, and fully-differential programmable gain amplifier 300 of FIG. 3. Operations of process 400 may be performed by one or more components of a fully-differential programmable gain amplifier. Process 400 may be performed to control distortion and switching interference during amplification.

Process 400 includes receiving input at block 405 and receiving a control signal, such as a gain control input, at block 410. According to one embodiment, input received at block 405 relates to an input signal, such as a differential input signal or single ended signal received. Process 400 may be employed to control the amplification of the signal and or signals received at block 405 based on a gain control signal received at block 410. According to one embodiment, gain control signals may be DC signals. Process 400 may optionally include isolate the gain control input from an amplifier at block 411. Isolation at block 410 may be performed by a galvanic isolator of the fully-differential programmable gain amplifier.

At block 415, process 400 can include applying a signal gain to received input. Block 414 may be performed by a programmable gain unit of the fully-differential programmable gain amplifier. Based on a first and second input signal detected by the programmable gain unit and amplified at block 415, wherein the signal is amplified based on a gain control signal received at block 410. Converting at block 415 may include accepting feedback from a correction module, such as feedback generated at block 420.

As a result of applying a signal gain at block 415, process 400 can supply at least one output current mode signal from to first current mode output and to a second current mode output to provide a differential input signal. Output of the programmable gain module at block 415 may be in response to and controllable by a control signal received by the fully-differential programmable gain amplifier.

At block 420, process 400 can include detecting a common-mode signal. Process 400 may be performed to control distortion and switching interference during amplification. Block 420 may include sensing the common mode signal on the outputs of a first current path and a second current path of a programmable gain element (e.g., programmable gain element 310), and comparing the common mode signal on the outputs of a first current path and a second current path with the ground. An amplifier (e.g., amplifier 321) of the fully-differential programmable gain amplifier can sense a common mode voltage to feed a common mode of the programmable gain module. The common mode signal on the outputs of a first current path and a second current path (e.g., first current mode output 312, the second current mode output 314) with the ground may be amplified to produce an error signal at block 420. The resulting error signal may be applied (e.g., see output path of block 420) as a digital control signal for multiplying DACs of the programmable gain element at block 415. In that fashion, feedback may be provided by a correction module to the programmable gain module by sensing signal errors from the amplified first and second input signal.

Operations at blocks 415 and 420 may be performed to control differential input to a differential module. Operations at block 415 can include a programmable gain module receiving control signals to adjust amplification of at least one signal received relative to the first input first and second input signals. An amplifier of a correction module coupled to the programmable gain module, may be configured to sense a common-mode signal between first current mode output and second current mode output and to provide corrective feedback to the programmable gain module at block 420. The amplifier may be configured as a voltage follower with the positive input connected to a voltage ladder between the circuit paths of the amplified first and second input signals, the negative input connected to the voltage follower's output via a negative feedback loop (e.g., 325), and output connected to the floating ground of the programmable gain module. The correction module can sense the common-mode signal between the amplified first and second input signals and send corrective feedback to the programmable gain module. As such the correction module compensates for distortion caused by MOSFET switches of the fully-differential programmable gain amplifier. The amplifier amplifies the common mode signal on the outputs of the first current path and the second current path with the ground to produce an error signal at block 420. The error signal is supplied to the programmable gain module for multiplying digital to analog conversion at block 415.

At block 425, process 400 can include generating a differential voltage. By way of example, a differential module (such as differential module 330 including a current-to-voltage converter 331) produces a positive and a negative output signal. The output signals are opposite to each other and equal in magnitude to the difference between the amplified first and second input signals. The output signals at block 425 can include differential output. The output signals at block 425 can include converting the differential input signal to output an amplified input signal based on the control signal. Operations at block 425 may be performed by a differential module including a fully-differential current-to-voltage converter with a first resistive feedback loop connecting the positive output signal path to the amplified first signal path and a second resistive feedback loop connecting the negative output signal path to the amplified second signal path. The fully-differential programmable gain amplifier is configured to control distortion and switching interference during amplification.

While this disclosure has been particularly shown and described with references to exemplary embodiments thereof, it will be understood by those skilled in the art that various changes in form and details may be made therein without departing from the scope of the claimed embodiments.

What is claimed is:

1. A fully-differential programmable gain amplifier comprising:
   a first input;
   a second input;
   a first output;
   a second output;
   a programmable gain module coupled to the first input and the second input, the programmable gain module including
      a data latch circuit configured to
         control a first set of switches for a first resistive ladder network to provide output to a first current mode output, and
         control a second set of switches for a second resistive ladder network to provide output to a second current mode output;
      an amplifier coupled to the first current mode output, the second current mode output, and the data latch circuit, the amplifier configured to apply common mode voltage to the data latch circuit; and
      a current-to-voltage converter coupled to the first current mode output, the second current mode output, the first output and the second output, the current-to-voltage converter configured to
         receive at least one output current mode signal from the first current mode output and the second current mode output, and
         produce an output signal by converting differential input received from the at least one output current mode signal from the first current mode output and the second current mode output.

2. The fully-differential programmable gain amplifier of claim 1, wherein the programmable gain module is a dual multiplying digital to analog converter.

3. The fully-differential programmable gain amplifier of claim 1, wherein the programmable gain module includes
   the first resistive ladder network coupled to the first input,
   the first set of switches for the first resistive ladder network, the first set of switches coupled to a first current mode output,
   the second resistive ladder network coupled to the second input, and
   the second set of switches for the first second ladder network, the second set of switches coupled to a second current mode output,
   the data latch circuit configured to control the first set of switches for the first resistive ladder network to provide output to the first current mode output, and control the second set of switches for the second resistive ladder network to provide output to the second current mode output.

4. The fully-differential programmable gain amplifier of claim 1, wherein the programmable gain module receives control signals to adjust amplification of at least one signal received relative to the first input and second input signals.

5. The fully-differential programmable gain amplifier of claim 1, wherein the amplifier is a voltage follower with a positive input connected to a voltage ladder between the first current mode output and second current mode output, a negative input connected to an output of the voltage follower by a negative feedback loop and a floating ground supply of the programmable gain module.

6. The fully-differential programmable gain amplifier of claim 1, wherein the amplifier is a correction module configured to sense a common-mode signal between first current mode output and the second current mode output and to provide corrective feedback to the programmable gain module.

7. The fully-differential programmable gain amplifier of claim 1, wherein the current-to-voltage converter is differential module configured to produce a positive output signal to the first output and a negative output signal to the second output, wherein the first output and second output are opposite each other and equal in magnitude to a difference between the amplified first and second input signals.

8. The fully-differential programmable gain amplifier of claim 1, wherein the current-to-voltage converter includes a first output feedback loop coupled to the first output and an input of the current-to-voltage converter, and a second output feedback loop coupled to the second output and an another input of the current-to-voltage converter.

9. The fully-differential programmable gain amplifier of claim 1, further comprising a floating supply to power the programmable gain module.

10. The fully-differential programmable gain amplifier of claim 1, further comprising a galvanic isolator coupled to the programmable gain module, the galvanic isolator configured to block low voltage DC current to the programmable gain module.

11. A fully-differential programmable gain amplifier comprising:
   a first input;
   a second input;
   a first output;
   a second output;
   a programmable gain module coupled to the first input and the second input, the programmable gain module including
      a first resistive ladder network coupled to the first input,
      a first set of switches for the first resistive ladder network, the first set of switches coupled to a first current mode output,
      a second resistive ladder network coupled to the second input,
      a second set of switches for the second resistive ladder network, the second set of switches coupled to a second current mode output,
      a data latch circuit configured to
         control the first set of switches for the first resistive ladder network to provide output to the first current mode output, and
         control the second set of switches for the second resistive ladder network to provide output to the second current mode output;
      an amplifier coupled to the first current mode output, the second current mode output, and the data latch circuit, the amplifier configured to apply common mode voltage to the data latch circuit; and
      a current-to-voltage converter coupled to the first current mode output, the second current mode output, the first output and the second output, the current-to-voltage converter configured to
         receive at least one output current mode signal from the first current mode output and the second current mode output, and
         produce an output signal by converting differential input received from the at least one output current mode signal from the first current mode output and the second current mode output.

12. A method for a fully-differential programmable gain amplifier, the method comprising:

receiving, by a programmable gain module of the fully-differential programmable gain amplifier, an input signal;

receiving, by the programmable gain module, a control signal;

supplying, by the programmable gain module, at least one output current mode signal from to first current mode output and to a second current mode output to provide a differential input signal, wherein output of the programmable gain module is in response to the control signal;

sensing, by an amplifier of the a fully-differential programmable gain amplifier, a common mode voltage to feed a common mode of the programmable gain module; and producing, by a current-to-voltage converter of the fully-differential programmable gain amplifier, an output signal by converting the differential input signal to output an amplified input signal based on the control signal.

13. The method of claim 12, wherein the amplifier is configured as a voltage follower with a positive input connected to a voltage ladder between circuit paths of the amplified first and second input signals, a negative input connected to the voltage follower's output via a negative feedback loop, and output connected to the floating ground of the programmable gain module.

14. The method of claim 12, wherein a correction module senses the common-mode voltage between the amplified first and second input signals and sends corrective feedback to the programmable gain module.

15. The method of claim 12, wherein the correction module compensates for distortion caused by MOSFET switches of the fully-differential programmable gain module.

16. The fully-differential programmable gain amplifier of claim 11, wherein the programmable gain module receives control signals to adjust amplification of at least one signal received relative to first input and second input signals.

17. The fully-differential programmable gain amplifier of claim 11, wherein the amplifier is a voltage follower with a positive input connected to a voltage ladder between the first current mode output and second current mode output, a negative input connected to an output of the voltage follower by a negative feedback loop and a floating ground supply of the programmable gain module.

18. The fully-differential programmable gain amplifier of claim 11, wherein the amplifier is a correction module configured to sense a common-mode signal between the first current mode output and the second current mode output and to provide corrective feedback to the programmable gain module.

19. The method of claim 12, wherein the current-to-voltage converter with a first resistive feedback loop connecting a positive output signal path to an amplified first signal path and a second resistive feedback loop connecting a negative output signal path to an amplified second signal path.

20. The method of claim 12, wherein the fully-differential programmable gain amplifier is configured to control distortion and switching interference during amplification by sensing common mode voltage on outputs of a first current path and a second current path, comparing common mode signal on the outputs of the first current path and a second current path with ground, amplifying the common mode signal on the outputs of the first current path and the second current path with the ground to produce an error signal, and applying the error signal to the programmable gain module for multiplying digital to analog conversion.

* * * * *